(12) United States Patent
DeLarge (10) Patent No.: US 9,275,835 B2
(45) Date of Patent: Mar. 1, 2016

(54) PLASMA GENERATING DEVICE WITH MOVING CAROUSEL AND METHOD OF USE

(71) Applicant: Gregory DeLarge, Carson City, NV (US)

(72) Inventor: Gregory DeLarge, Carson City, NV (US)

( * ) Notice: Subject to any disclaimer, the term of this patent is extended or adjusted under 35 U.S.C. 154(b) by 130 days.

(21) Appl. No.: 14/089,175

(22) Filed: Nov. 25, 2013

(65) Prior Publication Data

US 2014/0144877 A1    May 29, 2014

Related U.S. Application Data

(60) Provisional application No. 61/731,422, filed on Nov. 29, 2012.

(51) Int. Cl.
*H01L 21/306* (2006.01)
*H01J 37/32* (2006.01)

(52) U.S. Cl.
CPC ..... *H01J 37/32091* (2013.01); *H01J 37/32752* (2013.01)

(58) Field of Classification Search
CPC ............... H01J 37/32091; H01J 37/32752; H01J 37/32761
USPC ............. 156/345.31, 345.43, 345.48, 345.51, 156/345.54, 345.55; 216/67, 71
See application file for complete search history.

(56) References Cited

U.S. PATENT DOCUMENTS

| | | | |
|---|---|---|---|
| 2009/0139453 A1* | 6/2009 | Chen et al. | 118/723.1 |
| 2009/0200269 A1* | 8/2009 | Kadkhodayan et al. | 216/71 |
| 2011/0209830 A1* | 9/2011 | Hirono et al. | 156/345.37 |

* cited by examiner

*Primary Examiner* — Binh X Tran
(74) *Attorney, Agent, or Firm* — John D. Long, Esq; Long & Chybik (57) ABSTRACT

One possible embodiment of the invention could be a plasma reactor chamber and method of operating same wherein the plasma reactor chamber comprises a set of chamber walls and a door that when closed seals the plasma reactor chamber air-tight; one or more RF electrodes with at least one RF electrode being a power RF electrode; and a structure that moves one or more specimens proximate to the one or more RF electrodes.

14 Claims, 4 Drawing Sheets

PLASMA GENERATING DEVICE WITH MOVING CAROUSEL AND METHOD OF USE

STATEMENT REGARDING FEDERALLY FUNDED STATEMENT REGARDING FEDERALLY SPONSORED RESEARCH OR DEVELOPMENT

Not Applicable.

REFERENCE TO A "MICROFICHE APPENDIX"

Not Applicable.

FIELD OF THE INVENTION

The present invention generally relates to plasma generating devices. More particularity to those plasma generating devices that substantially incorporate a structure that may move one or more specimens through a plasma field.

BACKGROUND

Plasma generating devices may be used for a variety of purposes such as plasma etching, deposition/coating, cleaning and the like to manufacture or further process various products such as printed circuit boards (PCB) or a printed wire boards (PWB). These devices may generate their plasma fields by applying an electromagnetic radiation (e.g., for many plasma applications, this electromagnetic radiation could emanate at a Radio Frequency or RF of 13.56 MHz, although other frequency electromagnetic radiation may be used for other plasma applications) to an internal environment handled by the device. If the device's internal environment further contains a gas (e.g., fluorine, oxygen, chlorine, or the like) then the emitted electromagnetic radiation may then place the atoms of said gas into a highly energized state that splits those atoms into electrons and ions that may then react with the atoms/molecules of the material (e.g., the specimen) to be altered by the plasma field. By controlling the various plasma field generation parameters such as RF power, chamber pressure, gas flow, temperature, exposure time, and the like, various useful changes can be imposed by plasma field upon the specimen (e.g., an etching action.)

One version of a plasma generating device could be a plasma etching device generally comprising a door and a set of walls that generally form a substantially airtight plasma reactor chamber with a hollow interior. The hollow interior for this version could also contain a plurality of RF electrodes that could be powered by electromagnetic radiation (e.g., RF) generation system. The plasma reactor chamber could be further vented by a vacuum system and filled by a gas system. All of these systems could be controlled by appropriate electronics/software (e.g., electronic controller) utilizing operator interface controls (e.g., a control panel.) These various systems could be structurally supported by the device's housing.

The RF electrodes could be plate-shaped and be arranged in a horizontally stacked set. Within this set, the RF electrodes could be spaced apart from one another, alternating between power and ground RF electrodes. These electrodes could further act as support or shelving that could hold several specimens (e.g., PCBs or the like) in a manner that each specimen is singularly being held between a ground electrode and a power electrode.

When such a plasma generating device is used for a coating function, which demands less precision than plasma etching action, a fluid environment may be substituted for the gas environment although a gas environment may be used for the coating function. In this coating function, the electrode-generated electromagnetic field may then create from the liquid/gas present in the plasma reactor chamber a precipitation that is subsequently deposited upon a specimen as a coating (e.g. resulting in a generally protective encapsulation of PCB/PWB.)

The plasma generating devices could be also used within various PCB/PWB manufacturing processes. First step could be the forming a laminate made from copper conduction layers sandwiched between non-conductive layers. Holes (e.g., Pass Through Holes or PTH) could then be drilled laterally through the laminate to substantially provide the boards' electrical connections. After a series of subsequent intermediate processes, the plasma generating devices could then be used to clean (e.g., desmear) and then plate (e.g., etched back) the drilled holes.

Such plasma actions could start with a specimen being substantially placed in between (e.g., sandwiched by) a power RF electrode and a ground RF electrode with the plasma reactor chamber then being closed and otherwise sealed. A vacuum could then be induced to remove an outside/ambient atmosphere from the plasma reactor chamber's hollow interior. A plasma forming gas (e.g., chlorine, fluorine, oxygen, etc.) or liquid (for coating action) could then be introduced into the plasma reactor chamber's hollow interior. The RF electrodes within the hollow interior may then energized to generate an electromagnetic field (e.g., radio frequency-based) to create the plasma field. The plasma field could then act upon the specimen to provide the desired plasma type action (e.g., etching, desmearing, etc.)

When the desired plasma action is deemed suitably completed, the RF electrodes may be de-energized; the liquid/gas environment may be removed from the hollow interior; and the outside/ambient atmosphere could be reintroduced into the hollow interior. The plasma reactor chamber may then be unsealed and the processed specimen(s) may be removed from the hollow interior allowing the plasma device to process additional specimens.

Plasma etching devices that process several specimens at the same time utilizing stacked, spaced-apart RF electrodes may encounter a variety of issues regarding the plasma field generation. If a constant and uniform plasma field generation does not occur then uneven etching may result (e.g., "undercooking" some specimens while "overcooking" other specimens; and/or having some portions of one specimen being "undercooked" while remaining portions are "overcooked".) Such impaired plasma field generation may be caused by the general difficulty in controlling RF electromagnetic emissions for plasma generation (e.g., the electrodes are basically acting like antennas); having the RF electromagnetic field unwantedly grounding out at other points in the plasma reactor chamber besides at the electrodes; and other factors.

What might be needed is a plasma generating device whose plasma reactor chamber that allows one or more specimens to be moved proximate to RF electrode(s) and to be moved through the created plasma field. This specimen movement could allow more energy to be applied to the RF electrodes; possibly cause a reduction in the grounding effect; possibly increase control over the RF electromagnetic field with a general result of greater stability and uniformity in the plasma field generation.

This solution may further allow a definite amount of polytetrafluoroethylene placed proximate to one or more RF electrodes to emit or otherwise generate a sufficient amount of plasma formation gas thus possibly providing a green effect that could reduce the need for separately introducing additional plasma formation gas into the plasma reactor chamber.

SUMMARY OF ONE EMBODIMENT OF THE INVENTION

Advantages of One or More Embodiments of the Present Invention

The various embodiments of the present invention may, but do not necessarily, achieve one or more of the following advantages:

to provide a plasma generating device whose plasma reactor chamber's hollow interior contains a suitable structure such as a carousel that can movably present one or more specimens proximate to electromagnetic field generating electrodes;

the ability to movably present one or more specimens through a plasma field created by RF field generating electrodes;

to provide a plasma generating device that movable rotates one or more specimens proximate electromagnetic field generating electrodes used to create a plasma field;

the ability to move one or more specimen in a wide variety of orientation relative to RF field generating electrodes to subject the one or more specimens to a plasma field;

the ability to plasma treat several specimens in a single operation in a manner that reduces the grounding effect;

to provide a definite amount of polytetrafluoroethylene (PTFE) proximate RF electrode(s) that when energized by the RF electrodes may otherwise reduce the amount of plasma forming gas to be introduced from a source external to the plasma reactor chamber;

to ability to reduce the amount of fluoride gas that is released into the atmosphere by plasma generating devices;

the ability to energize a definite amount of Polytetrafluoroethylene (PTFE) within a plasma reactor chamber to give off a fluorine gas that is generate a plasma field;

to provide a movement of one or more specimens through a plasma field to subject the one or more specimens to a plasma actions; and the ability to move one or more specimens by a rotating specimen support structure proximate to one or more RF electrodes of the plasma generating device.

These and other advantages may be realized by reference to the remaining portions of the specification, drawings, and abstract.

BRIEF DESCRIPTION OF ONE EMBODIMENT OF THE PRESENT INVENTION

One possible embodiment of the invention could be a plasma reactor chamber comprising: a set of chamber walls and a door that when closed seals the plasma reactor chamber air-tight; one or more RF electrodes with at least one RF electrode being a power RF electrode; and a structure that moves one or more specimens proximate to the one or more RF electrodes.

Another possible embodiment of the invention could be the plasma reactor chamber comprising a set of walls and a door that when closed reversibly seals the plasma reactor chamber air-tight: one or more RF electrodes with at least one RF electrode being a power RF electrode; a definite amount of polytetrafluoroethylene that is energized by the one or more RF electrodes; a structure supporting one or more specimens proximate to the power RF electrode; wherein an energizing of the one or more power RF electrodes causes the polytetrafluoroethylene to emit a plasma forming gas within the plasma reactor chamber.

Yet another possible embodiment of the invention could be a method of operating a plasma reactor chamber comprising of the following steps but not necessarily in the order shown providing a plasma reactor chamber that is sealable and air-tight when sealed, the plasma reactor chamber containing one or more RF electrodes and a structure that can move one or more specimens proximate to the one or more RF electrodes; removing the air from plasma reactor chamber; energizing the one or more RF electrodes; introducing a plasma forming gas into the plasma reactor chamber; forming a plasma field proximate to one or more RF electrodes; and moving one or more specimens through the plasma field.

Still yet another possible embodiment of the invention could be a method of operating a plasma reactor chamber comprising of the following steps but not necessarily in the order shown providing a plasma reactor chamber that is sealable and air-tight when sealed, the plasma reactor chamber containing one or more RF electrodes, a structure that support the one or more specimens proximate to the one or more RF electrodes and a definite amount of polytetrafluoroethylene that is located proximate to the one or more RF electrodes; removing air from plasma reactor chamber; energizing the one or more RF electrodes; energizing of the definite amount of polytetrafluoroethylene to create a plasma forming gas within the plasma reactor chamber; and forming a plasma field proximate to the one or more RF electrodes.

The above-description sets forth, rather broadly, a summary of one embodiment of the present invention so that the detailed description that follows may be better understood and contributions of the present invention to the art may be better appreciated. Some of the embodiments of the present invention may not include all of the features or characteristics listed in the above summary. There are, of course, additional features of the invention that will be described-below and will form the subject matter of claims. In this respect, before explaining at least one preferred embodiment of the invention in detail, it is to be understood that the invention is not limited in its application to the details of the construction and to the arrangement of the components set forth in the following description or as illustrated in the drawings. The invention is capable of other embodiments and of being practiced and carried out in various ways. Also, it is to be understood that the phraseology and terminology employed herein are for the purpose of description and should not be regarded as limiting.

DESCRIPTION OF CERTAIN EMBODIMENTS OF THE PRESENT INVENTION

In the following detailed description of the preferred embodiments, reference is made to the accompanying drawings, which form a part of this application. The drawings shown by way of illustration, specific embodiments in which the invention may be practiced. It is to be understood that other embodiments may be utilized and structural changes may be made without departing from the scope of the present invention.

The present invention 10 could comprise of a plasma generating device 20 that creates and uses plasma for etching, deposition (e.g. coating), cleaning and the like of specimens placed within the plasma generating, device and a method or process 200 for its operation. As substantially shown in FIG. 1, the plasma device 20 could be comprised of a plasma reactor chamber 22 containing one or more one RF electrodes (e.g. the RF electrode generally being plate-shaped and capable of generating RF electromagnetic field when suitably energized); a multi-station carousel or other suitable structure 26 for generally supporting one or more specimens 12 (e.g. moving materials through a plasma field) proximate to RF electrode(s) 24; a multi-station carousel powering system 28 for generally rotating the multi-station carousel 24 in a controlled manner; an electrode powering system 30 (e.g., an RF electromagnetic field generator) for powering RF electrode (s) 24; an electronic controller 32 for controlling the various systems; a control panel 34 for providing an operator interface to the electronic controller 32, all of which could be structurally supported by the device's housing 36. Embodiments of the invention 10, which generally provide a gas environment for plasma generation, could further include a vacuum system 38 for removing ambient atmosphere from the plasma reactor chamber 22 and as needed a gas supplying system 40 for introducing a gas into the plasma reactor chamber 22.

Figure 1:
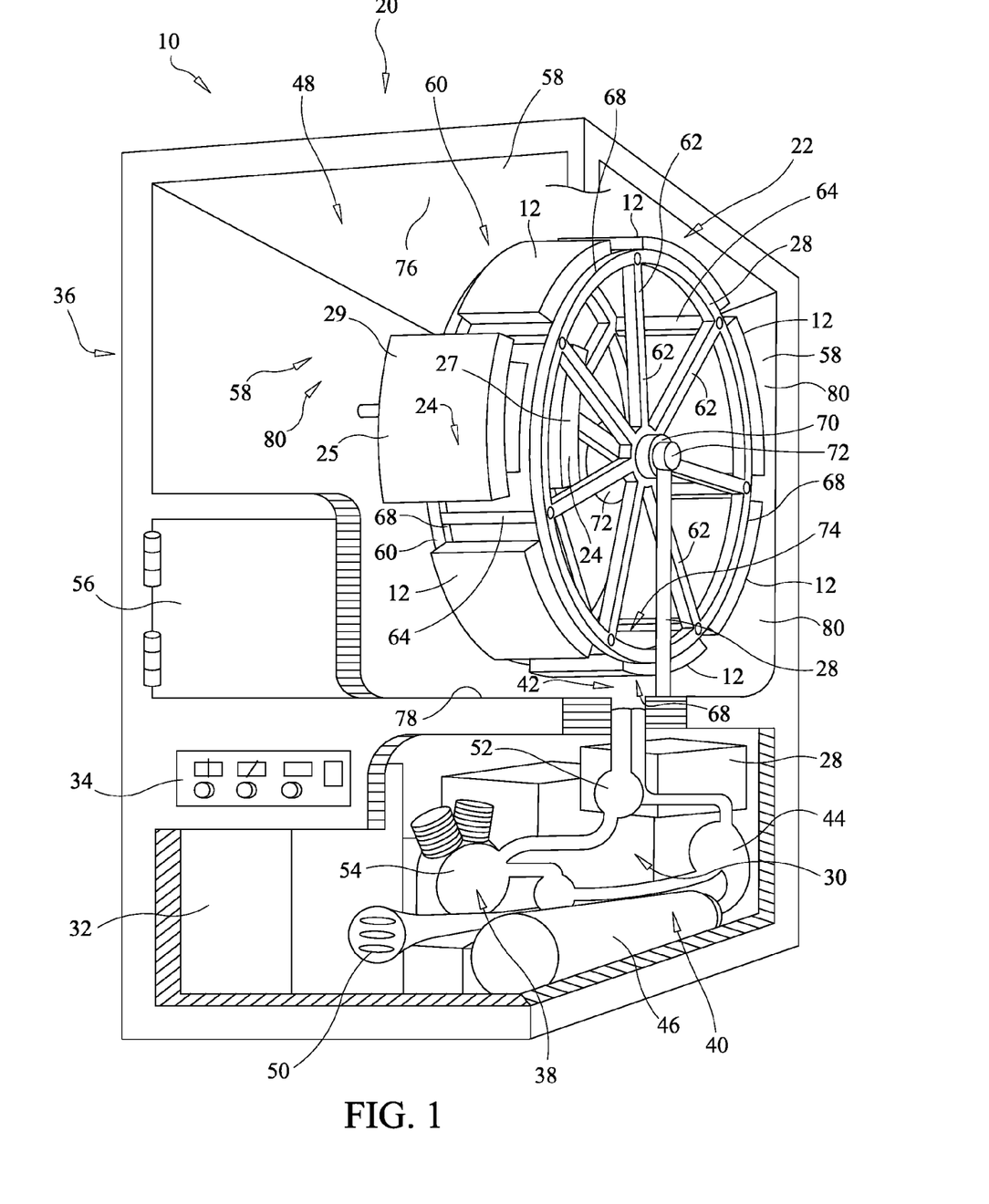
FIG. 1 is substantially a cutaway perspective view of the present invention showing one embodiment of its plasma reactor chamber.

The gas supplying system 40 could be employed if a particular setup or operation required a separate or external introduction of gas into the plasma reactor chamber 22. In those embodiments of the invention 10 using a definite amount of polytetrafluoroethylene (PTFE) 29 (i.e., polytetrafluoroethylene may be sold under the trademark Teflon®, the registered trademark of E. I. Du Pont DeNemours and Company, 1007 Market Street Wilmington Del. 19898) proximate to the one or more RF electrodes 24 when suitably energized could supply sufficient fluorine gas for plasma operations the gas supply system 40 would not be needed to supply plasma forming gas from a separate and external source. The gas supplying system 40 could comprise of an inlet port 42, a gas regulator 44, and a tank(s) 46 of desired gas(es) (e.g., fluorine, chlorine, oxygen, etc.) The inlet port 42 could penetrate the plasma reactor chamber 22 into its hollow interior 48 to substantially continuously connect the hollow interior 48 to the gas regulator 44 for importing selected gas(es) (e.g., chlorine, fluorine oxygen and the like) in desired amounts, concentrations, and proportions from the tank(s) 46. The gas supplying system 40 could generally be located outside the hollow interior 48 and generally proximate to the plasma reactor chamber 22.

The vacuum system 38 could be comprised of an exhaust outlet or port 50, a vacuum regulator 54, and a vacuum pump 54. An exhaust port 50 could penetrate the plasma reactor chamber 22 to substantially continuously connect the hollow interior 48 to a vacuum pump 54 generally located outside the hollow interior 48 but generally proximate to the plasma reactor chamber 22. The vacuum regulator 52 could be connected to the vacuum pump 54 and the exhaust port 50. The vacuum regulator 52 could activate and deactivate the vacuum pump 54 and/or control the orifice size of the exhaust port 50 as necessary to create a vacuum (e.g., sub-atmospheric pressure) in the vacuum system 38 and subsequently in the hollow interior 48. In at least one embodiment, the vacuum system 50 could further feature a filter (not shown) or scrubber (not shown) to otherwise neutralize or contain harmful elements from being vented from the hollow interior 36.

The gas supplying system 40, vacuum system 38, electrode powering system 30, carousel powering system 28 and other components of the invention 10 could be placed under the command of an electronic controller (e.g., a computer or CPU) 32 having appropriate software that could be programmed to operate these systems and other device components under certain parameters along an operator-defined timeframe. For example, the electronic controller 32, in controlling the gas supplying system 40 and the vacuum system 38 concurrently, could appropriately manage the flow and pressures of the desired gas(es) into (and out of) the hollow interior 48. The electronic controller 32 could also be linked to the control panel 34 that could provide operational feedback to an operator (not shown) as well as be an interface for the operator (not shown) to provide input into the electronic controller 32 as to the overall operation of the invention 10.

The plasma reactor chamber 22 could be formed by a door 56 and a set of walls 58, the walls 58 generally being continuously connected together to generally form the plasma reactor chamber's hollow interior 48. The door 56 in connecting to the walls 58 could reversibly seal, in a substantially air-tight manner, the hollow interior 48 from an outside environment so as to generally control access from the outside environment to the hollow interior 48. The door 56 could be used to control the placement of specimens 12 (such as PCB/PWB) into (and their removal from) the hollow interior 48. In at least one embodiment, the door 56 and walls 58 could be made from aluminum to resist the attraction and dissipation of the generated plasma field.

The multi-station carousel 26 could be located within the hollow interior 48 and can be a means of supporting one or more specimens 12 proximate to the one or more RF electrodes 24. In one embodiment of the invention 10, the multi-station carousel 26 could be movably attached to the plasma reactor chamber 22. In this embodiment, the multi-station carousel 26 could move in a rotational motion so that a portion of the multi-station carousel 26 could pass proximate to the one or more RF electrodes 24. In one version, only power RF electrodes 25 are used and either structure of the multi-station carousel 26, the walls 58, the door 56 or like are used to ground the energizing process without the need for a dedicated RF ground electrode(s) 27.

In an embodiment where the multi-station carousel 26 could rotatably pass in between a pair of ground and power electrodes 25, 27 generally held the opposing and spaced-apart (e.g., parallel configuration.) The RF ground electrode 27 could be placed outside the structure of the multi-station carousel 26 while the RF power electrode 25 of the pair could be placed within the structure of the multi-station carousel 26. Other versions of the invention 10 could reverse these RF electrode positions with the RF ground electrode 27 could be placed within the structure of the multi-station carousel 26 while the RF power electrode 25 could placed outside the structure of the multi-station carousel 26.

In other versions (not shown), the multi-station carousel 26 could move through a plurality of RF electrode pairings 24 (e.g. one RF power electrode paired with one RF ground electrode) being deployed about the carousel's outer edge 28. It is generally thought that such a configuration of multiple electrode pairs 24 may have an overall degrading affect upon the electrode pairs' individual capacities to generate stable and uniform plasma fields.

In one embodiment, the multi-station carousel 26 could have a vertical orientation (e.g., a Ferris wheel like appearance) although a multitude of different orientations could be used with carousel 26 as it applies to carousel's movably mounting to the plasma reactor chamber 22. The multi-station carousel 26 could employ a wide variety different structures to support (e.g. move) the one or more specimens through a plasma field. One possible version of the multi-station carousel 26 could be constructed from two spoked rings 62 held apart in opposing yet parallel configuration by spacing bars 64 placed between the spoked rings 62. The spacing 64 bars could be spaced apart from one another to further denote a series of attachment spaces 68 along the carousel's outer edge 60. Each attachment space 68 could reversibly receive and support a respective specimen 12. The non-ring ends of each spoke of the spoked ring 62 could attach to a respective axle hub 70, each axle hub 70 being movably attached to a respective chamber attachment points 72 also located within the hollow interior 48. Each chamber attachment point 72 could be attached to one or more chamber side walls 80.) The multi-station carousel powering system 28 could be mechanically connected to the multi-station carousel 26 to rotate the multi-station carousel 26 by its axle hubs 70 about the plasma reactor chamber's attachment points 72. The multi-station carousel powering system 32 could be controlled via the electronic controller 32 to continuously rotate the carousel's outer edge 60 between at least one pair electrodes 24 at a desired speed and duration. In one possible version, the multi-station carousel powering system 28 could pass through one attachment point 72 to mechanically connect to its respective axle hub 70 to rotate the multi-station carousel 26 within the plasma reactor chamber In one possible embodiment using only power RF electrode(s) 25, the power RF electrode(s) 25 could be insulatedly connected to a wall 58 so as to substantially locate the power RF electrode 27 up and over (proximate to but not contacting) the outside of the carousel's outer edge 60 (e.g., circumference) to otherwise avoid other contact with the door 56 and walls 58.

In other embodiments using paired RF electrodes, one RF electrode 24 (e.g., power electrode 27) could be insulatedly connected to a wall 58 that the power RF electrode 27 is held up and over the outside of the carousel's outer edge 60 (e.g., circumference) to otherwise avoid other contact with the door 56 and walls 58. The ground RF electrode 25 could be located within but not touching the interior carousel structure 74 (e.g., between the spoked rings 62). The ground RF electrode 25 could be proximate to the inside of the carousel's outer edge 60 to generally complete the sandwiching of a portion of the carousel outer edge 60 (in other versions, the positioning of the ground and power RF electrodes could be switched.) Both RF electrodes 24 of the RF electrode pair should have sufficient distance from the multi-station carousel 26 to allow a specimen/carousel combination to generally pass freely between the paired RF electrodes 24 yet be close enough together to be able generate a uniform and stable plasma field.

RF electrodes 24 could be connected to the electrode powering system 30 (e.g., an RF or radio frequency electromagnetic field generator.) The ground RF electrode 25 could be connected to the electrode powering system 30 through an electrical connection (not shown) insulatedly passing though respective attachment point 72/axle hub 70. A mechanical connection supporting the ground RF electrode 24 could movably pass through the axle hub 70 to connect to insulatedly anchor the ground electrode 24 to the wall 58. If only the power RF electrodes are used, they could be connected to the electrode powering system 30 while the carousel 26, walls 58, door 56, and the like could be connected to the electrode powering system 30 as a ground.

Figure 2:
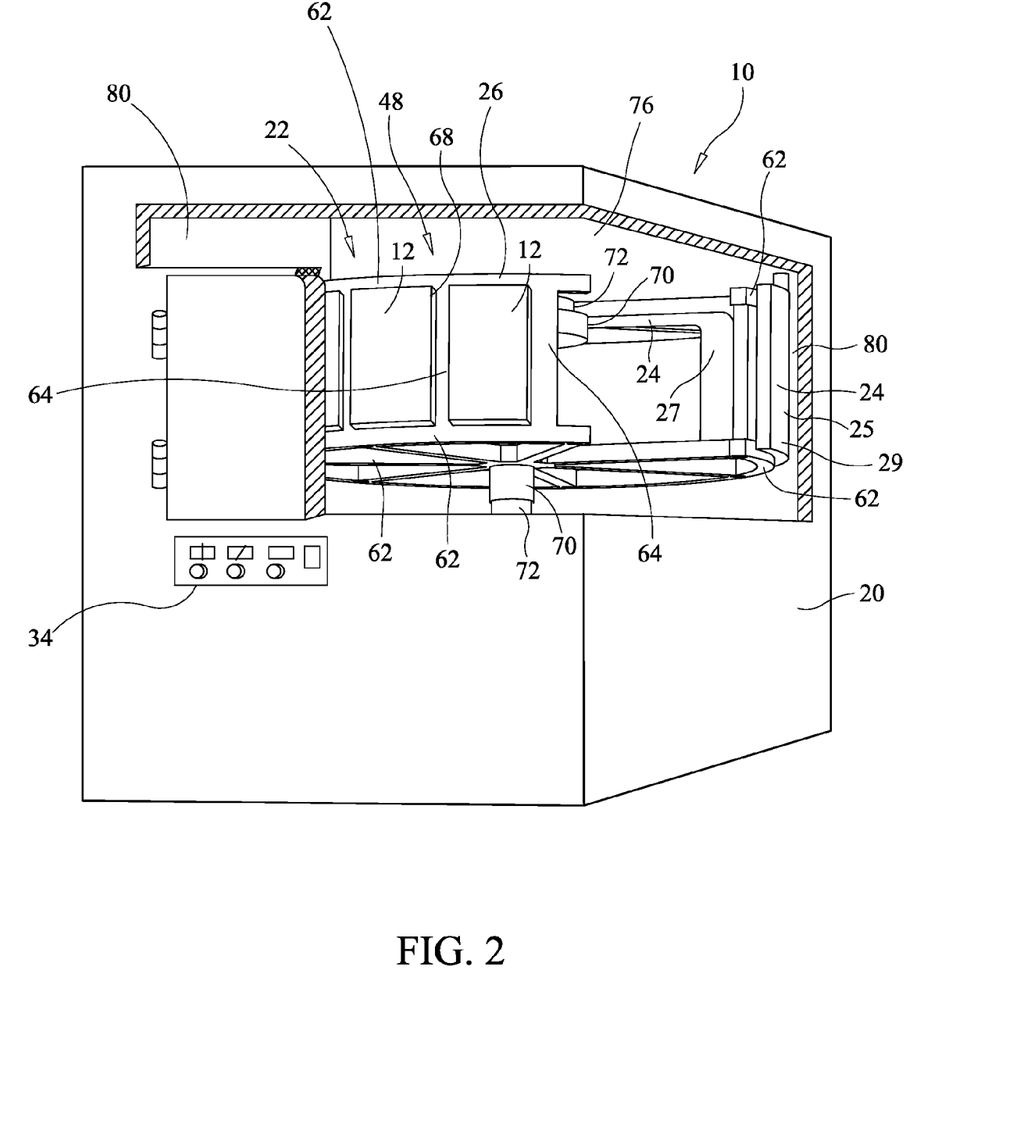
FIG. 2 is substantially a cutaway perspective view of another embodiment of the plasma reactor chamber of the present invention.

As shown in FIG. 2, another embodiment of the invention 10, the multi-station carousel 26 and one or more RF electrodes 24 could have the same general construction as earlier mentioned (as substantially shown in FIG. 1) but that the attaching points 72, instead of being anchored to side walls 80, could be attached to the bottom wall (floor) 78 and the top wall 76 (ceiling) of the plasma reactor chamber 22 to movably mount the multi-station carousel 26 in a horizontal configuration (e.g. generally providing the multi-station carousel 26 with a "merry-go-round" appearance.)

Figure 3:
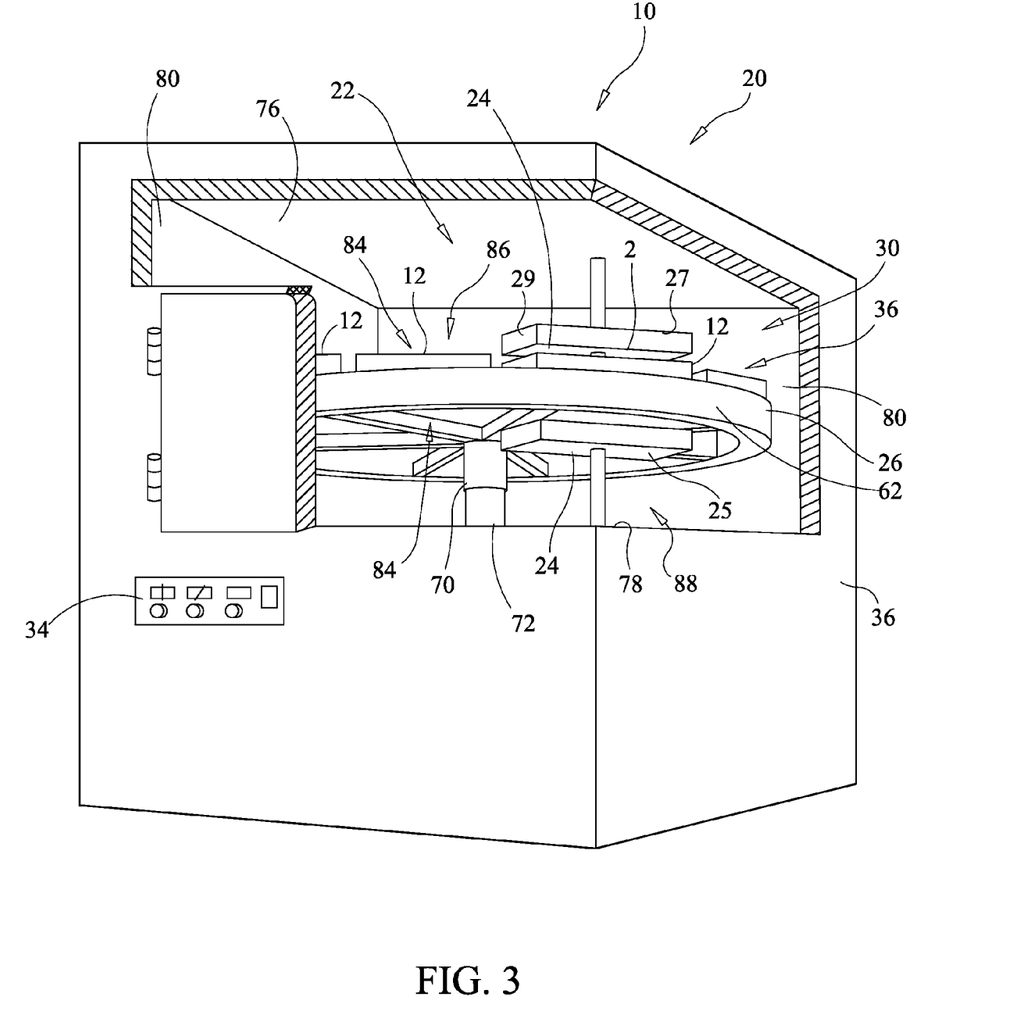
FIG. 3 is substantially a cutaway perspective view of yet another embodiment of the plasma reactor chamber of the present invention.

As substantially shown in FIG. 3, yet another embodiment could have the multi-station carousel 26 could have a more flatten disk appearance. The multi-station carousel 26 could be constructed as a spoked ring 62 to present the specimens 12 not on the carousal outer edge 60 but on a carousal side 84 by the carousal outer edge 60. The spoked ring 62 could also have at its center an axle hub 70 that rotates upon its respective attachment point 72 as attached to the bottom wall (e.g., floor) 78 of the plasma reactor chamber 22. The carousel powering system 28 could movably pass through that attachment point 72 to mechanically connect to one axle hub 70 to rotate the multi-station carousel 26 about its attachment point 72 within the hollow interior 48. RF electrode(s) 24 could be insulatedly connected to the walls 58 of the plasma reactor chamber 22 in a manner that allows the RF electrode(s) 24 to be powered by the electrode powering system 30. One such RF electrode 24 (e.g., the power RF electrode 25) could be placed over the top of the multi-station carousel 26 and proximate to the carousel outer edge 60 while the other RF electrode 24 (e.g., the RF ground electrode 27) could be positioned underneath multi-station carousel 26. In this manner, as multi-station carousel 26 rotates, the multi-station carousel's top side 86 and bottom side 88 by the carousel outer edge 60 could pass through (and is generally sandwiched between) the electrodes 24 of the electrode pair to move a specimen 12 singularly through the plasma field created by the RF electrodes 24.

In at least one embodiment not shown, the electrode pair 24 could further comprise a heat transfer system (not shown), wherein the power electrode 24 could be gun-drilled to provide fluid passageways (not shown) with the power electrode 24 further having an entrance and exit apertures to the fluid passageways (not shown.) Inlet and outlet pipes (not shown) could connect respectively to the entrance and exit apertures thus additionally connecting the power electrode 24 to the pump and heating/cooling capability (not shown). The passage ways, pump, cooling capability and the like could be appropriately filled with suitable heat transfer fluid (not shown.) The pump, cooling capability could be under the direction of the electronic controller 32 to generally cool and move the transfer fluid though the passageways/inlet and outlet pipes and the like. In this manner, the heat transfer system could help regulate the operational temperature of the power RF electrode to promote optimal plasma field generation.

In at least one embodiment of the invention 10, the plasma reactor chamber 22 could further comprise of a definite amount of polytetrafluoroethylene (PTFE) 29 that is located proximate to the RF electrodes 24 so the electromagnetic field created by the RF electrodes 24 could interact with the proximately located polytetrafluoroethylene 29 to release fluorine gas within the hollow interior 48 for plasma field generation. In one such version, one or more of the RF electrodes 24 (e.g., the power RF electrode 25) could be coated with polytetrafluoroethylene 29. In another version, a polytetrafluoroethylene sheet could be loosely wrapped around a RF electrode 24 (e.g., a RF power electrode 25.)

Figure 4:
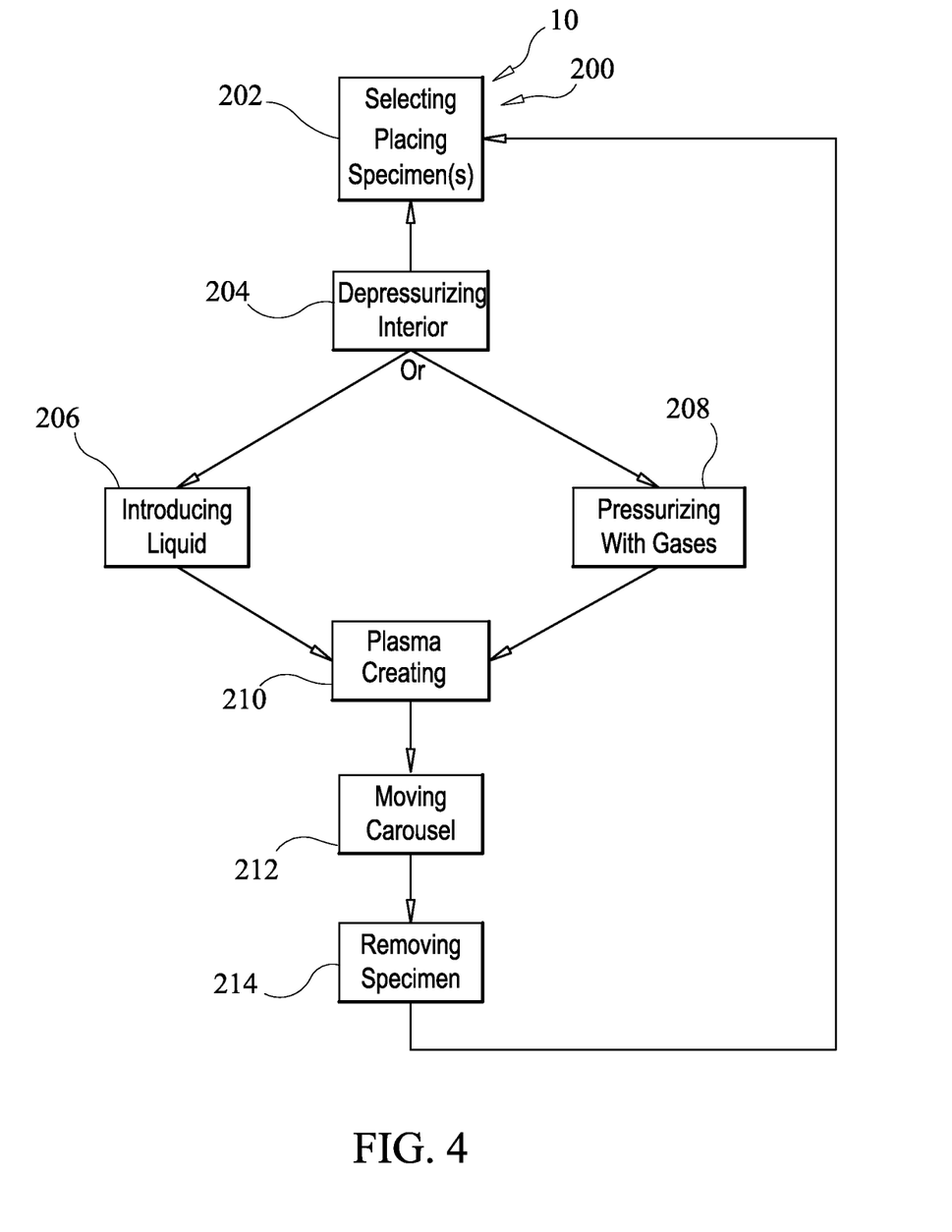
FIG. 4 is substantially a flowchart schematic showing one possible embodiment of method or process of operating the present invention.

As substantially shown in FIG. 4, the process or method 200 of operating the invention 10 could start with step 202, selecting and placing of specimens upon the multi-station carousel. Here, the hollow interior of the plasma reactor chamber could be initially vented to the outside atmosphere and have ambient atmospheric pressure in the hollow interior. The door could be opened to generally allow access to the hollow interior and to allow the specimen(s) to be appropriately secured upon the multi-station carousel (e.g., carousel top or carousel outer edge.) After such placement, the door to the chamber could be closed to generally seal the hollow interior. Upon substantial completion of this step, the process 200 could proceed to step 204, depressurizing the interior.

At step 204, depressurizing the interior, the vacuum pump system could be activated (e.g., via the control panel and the electronic controller) to reduce the amount of original ambient atmosphere present in the hollow interior to an operator-specified sub-atmosphere pressure level. At the substantial completion of this step, the method 200 could generally proceed to step 206, pressurizing the plasma reactor chamber with selected gas(es) or to step 208 introducing liquid into the plasma reactor chamber.

At step 206, introducing liquid into the plasma reactor chamber, (e.g., such as preparation for physical liquid deposition [PLD]) the liquid being introduced is capable of depositing a coating upon a specimen when specimen passes through a created plasma field. As the substantial completion of this step, the process 200 could continue onto step 210, plasma creation.

At step 208, pressurizing with selected gas(es), the gas system, in conjunction with the vacuum system, could be used to introduce the desired gas(es) at the desired pressure(s), concentration(s), and flow rate(s) into the chamber's interior. As plasma forming gas(es) is (are) used up in the generation of plasma, they could be replaced/supplemented with additional amount(s) of plasma forming gas(es) by the gas system. The gas system (e.g., its valves and sensors) as controlled by the electronic controller could be used to regulate the various aspects of introducing the desired gas(es) into the hollow interior.

In other embodiments of the invention using a definite amount polytetrafluoroethylene placed proximate to the RF electrodes, the energizing of the definite amount polytetrafluoroethylene by the RF electrodes to continuously release fluorine gas in to the plasma reactor chamber for plasma field generation could reduce or eliminate the need the need for the gas system to introduce an external and separate source of plasma forming gas. In this manner, the reduction in the amount of plasma forming gas as supplied by the gas system could allowing the invention to generally claim green or environmental beneficial effects as well as decreasing its operating costs. At the substantial completion of step 208, the process 200 could generally proceed to step 210, plasma creation.

At step 210, creating plasma, a plasma field could be initiated by generally making the electromagnetic field generator operative to substantially energize the power electrode creating a strong RF (radio frequency) electromagnetic field. The grounding RF electrode (or the carousel, wall, door, etc) to ground/return such energy flow back to the electromagnetic field generator. The RF electromagnetic field may be typically set to a frequency of 13.56 megahertz, applied at a several hundred watts (the actual wattage would generally depend on the size of the application.) The resulting oscillating electromagnetic or RF field generally ionizes the gas (or liquid) molecules present by stripping them of electrons, thus creating the plasma field.

In each cycle of the electromagnetic or RF field, the electrons may be electrically accelerated up and down within the chamber, sometimes striking the power RF electrode and sometime the chamber walls or ground RF electrode. At the same time, the much more massive ions may move relatively little in response to the RF electric field. When electrons are generally absorbed into the chamber walls they are simply grounded and do not alter the electronic state of the system. However, those electrons that are absorbed into the power RF electrode could cause the power RF electrode to build up a charge due to the DC Bias voltage of the electromagnetic field generator. The plasma itself then could develop a slightly positive charge due to the higher concentration of positive ions compared to free electrons. The resulting colliding ions then may react chemically with the surface of the specimen present within the plasma field. After this step has been initiated, the process 200 could proceed to step 212, moving the carousal.

In step 212, moving the carousal, the multi-station carousel powering system could be activating to provide a controlled powered rotation of the multi-station carousel proximate to the one or more RF electrodes. Utilizing the control panel to operate the electronic controller, the carousel movement can be controlled to substantially ensure that presence of the specimen(s) within the plasma field for sufficient time/repeated exposures to obtain the desired results and minimize undesired changes (e.g. "overcooking" or "undercooking" the specimen[s]). At the conclusion of the treatment of the specimens, the process 200 could proceed to step 214, removing the specimen(s) from the plasma reactor chamber.

In step 214, removing the specimen(s) from the plasma reactor chamber, after the specimen(s) have been suitably treated by the plasma process in the desired manner or at the desired parameters, the electrode power system could be de-energized; and the liquid/gas could be removed from the plasma reactor chamber, the hollow interior could be vented to the outside environment to generally restore ambient atmosphere within the plasma reactor chamber and substantially allowing the plasma reactor chamber to cool as needed as well. When the ambient environment has generally been restored and the plasma reactor chamber has sufficiently cooled, the door can be opened to unseal the plasma reactor chamber. The treated specimens can then be released from the multi-station carousel, the multi-station carousel being rotated by hand (or by the carousel power system) to clear any specimen(s) that are proximate to one or more RF electrodes.

After the treated specimens are generally removed from the plasma reactor chamber, the process 200 can then return to step 202 as needed to repeat a desired treatment with same or new specimens.

CONCLUSION

Although the description above contains many specifications, these should not be construed as limiting the scope of the invention but as merely providing illustrations of some of the presently preferred embodiments of this invention. Thus, the scope of the invention should be determined by the appended claims and their legal equivalents rather than by the examples given.

As can be seen in the Specification and Drawings, the present invention is a plasma etching device that may be used in the manufacture of circuit boards and the like. The invention promotes greater uniformity and control in plasma field generation when processing several specimens in a single operation by generally moving the specimens proximate to one or more RF electrodes/created plasma field. Subject the definite amount of the Polytetrafluoroethylene (PTFE) to a generated electromagnetic field could emit sufficient plasma forming gas needed to generate a plasma field. This electrode-based gas generation process could possibly reduce the amount of plasma forming gas needed to be separately introduced into the plasma reactor chamber's hollow interior resulting in making the invention more environmentally friendly and cost-efficient to run.

What is claimed is:

1. A plasma reactor chamber comprising:
   (a) a set of chamber walls and a door that when closed seals the plasma reactor chamber air-tight;
   (b) one or more RF electrodes with at least one RF electrode being a power RF electrode, the one or more RF electrodes upon activation emits RF electromagnetic radiation;
   (c) a structure that moves one or more specimens proximate to the one or more RF electrodes;
   (d) a definite amount of polytetrafluoroethylene affixed to one of the one or more RF electrodes;
   wherein the emitted RF electromagnetic radiation reacts with the definite amount of polytetrafluoroethylene to emit an amount of fluorine gas amount to be used to generate a plasma field within the plasma reactor chamber.

2. The plasma reactor chamber of claim 1 wherein the structure moves within the plasma reactor chamber so that a portion of the structure moves proximate to the one or more RF electrodes.

3. The plasma reactor chamber of claim 2 wherein the structure rotates within the plasma reactor chamber so that a portion of the structure rotates past the one or more RF electrodes.

4. The plasma reactor chamber of claim 2 wherein the structure is movably mounted in a non-horizontal orientation to the plasma reactor chamber.

5. The plasma reactor chamber of claim 1 wherein the one or more RF electrodes are placed within the structure.

6. The plasma reactor chamber of claim 1 wherein the movement of one or more specimens causes the one or more specimens to pass through a plasma field located proximate to one or more RF electrodes.

7. The plasma reactor chamber of claim 1 wherein the one or more specimens are moved in a non-horizontal orientation past the one or more RF electrodes.

8. The plasma reactor chamber comprising:
   (a) a set of walls and a door that when closed reversibly seals the plasma reactor chamber air-tight;
   (b) one or more RF electrodes that creates RF electromagnetic radiation within the plasma chamber when energized;
   (c) a definite amount of polytetrafluoroethylene being applied to at least one of the one or more RF electrodes;
   (d) a structure for supporting one or more specimens proximate to the one or more RF electrodes;
   wherein an energizing of the one or more power RF electrodes causes the definite amount of polytetrafluoroethylene to emit a plasma forming gas for the generation of a plasma field within the plasma reactor chamber.

9. The plasma reactor chamber of claim 8 wherein the structure for supporting one or more specimens moves the one or more specimens proximate to one or more RF electrodes.

10. The plasma reactor chamber of claim 8 wherein the structure for supporting one or more specimens is a carousel that is movably mounted within the plasma reactor chamber and at least portion of the carousel rotates past one or more power RF electrodes.

11. The plasma reactor chamber of claim 8 wherein the one or more specimens are moved in a non-horizontal orientation proximate to the one or more RF electrodes.

12. The plasma reactor chamber of claim 8 wherein the one or more specimens are moved in a horizontal orientation proximate one or more RF electrodes.

13. The plasma reactor chamber of claim 8 wherein the one or more RF electrodes is located within a structure of a carousel.

14. The plasma reactor chamber of claim 8 wherein the one or more RF electrodes is located outside a structure of a carousel.

* * * * *